United States Patent [19]

Park

[11] Patent Number: 4,926,386

[45] Date of Patent: May 15, 1990

[54] MEMORY SYSTEM FOR IMAGE PROCESSING HAVING ADDRESS CALCULATING CIRCUITRY PERMITTING SIMULTANEOUS ACCESS TO BLOCK HORIZONTAL SEQUENCE AND VERTICAL SEQUENCE SUBARRAYS OF AN ARRAY OF DATA

[76] Inventor: Jong W. Park, 389-2 Sunwha 1 Dong, Jung Ku, Daejeon, Chung-Nam, Rep. of Korea

[21] Appl. No.: 66,074

[22] Filed: Jun. 24, 1987

[30] Foreign Application Priority Data

Dec. 29, 1986 [KR] Rep. of Korea ............... 1986-11454

[51] Int. Cl.$^5$ ...................... G11C 7/00; G11C 8/00
[52] U.S. Cl. ................. 365/230.03; 365/239; 365/189.08; 365/230.08; 364/900
[58] Field of Search .................. 365/239, 230, 189

[56] References Cited

U.S. PATENT DOCUMENTS

4,355,376 10/1982 Gould ................................ 365/200

OTHER PUBLICATIONS

Bank of Memories System for Mutiword Access–C. D. Coleman & A. Weinberger; IBM Technical Disclosure Bulletin, vol. 9, No. 9, Feb. 1967; pp. 1182–1183.
Multiword, multidirectional random Access Memory System–A. Weinberger; IBM Technical Disclosure Bulletin, vol. 10, No. 7, Dec. 1967; pp. 997–998.
Illiac IV Software and Application Programming–David J. Kuck; IEEE Transactions on Computers, vol. C-17, No. 8, Aug. 1968; pp. 758–770.
Access and Alignment of Data in an Array Processor–Duncan H. Lawrie; IEEE Transactions on Computers, vol. c-24, No. 12, Dec. 1975; pp. 1145–1155.
Memory Systems for Image Processing–David C. Van Voorhis & Thomas H. Morrin; IEEE Transactions on Computers, vol. c-27, No. 2, FReb. 1978; pp. 113–125.
A Study on the Image Processor Memory Architecture–Bum Chun Lee & Jong Won Park; Proceedings of International Computer Symposium 1980 (vol. II); pp. 954–960.
The Organization and Use of Parallel Memories–Paul Budnik & David J. Kuck; IEEE Transactions on Computers, Dec. 1971; pp. 1566–1569.
Design of High–Speed Digital Divider Units–J. H. P. Zurawski & J. B. Gosling IEEE Transactions on Computers, vol. c-30, No. 9, Sep. 1981; pp. 691–699.

*Primary Examiner*—Stuart N. Hecker
*Assistant Examiner*—Alyssa H. Bowler
*Attorney, Agent, or Firm*—Oliff & Berridge

[57] ABSTRACT

A memory system for storing an $M \times N$ array of data elements and for permitting simultaneous access to selected block, horizontal sequence and vertical sequence subarrays defined by the parameters p and q comprises only (pg+1) memory modules for storing the $M \times N$ array of data; address calculating apparatus which does not use any modulo-(pg+1) operations for determining the distribution of the data elements of a selected subarray among the memory modules and for alocating different addresses to subarray data elements assigned to the same memory module according to memory module assignment and address assignment functions; address routing apparatus separate from the address calculating apparatus for routing the addresses produced by the address calculating apparatus to the memory modules; data routing apparatus for routing the data elements to the memory modules; and control and enabling apparatus for controlling the address calculating, address routing and data routing apparatus and for enabling only pg of the (pg+1) memory modules for storage of the data elements of the selected subarray, only one modulo-(pg+1) operation being required for the address routing and memory module enabling functions.

4 Claims, No Drawings

MEMORY SYSTEM FOR IMAGE PROCESSING HAVING ADDRESS CALCULATING CIRCUITRY PERMITTING SIMULTANEOUS ACCESS TO BLOCK HORIZONTAL SEQUENCE AND VERTICAL SEQUENCE SUBARRAYS OF AN ARRAY OF DATA

BACKGROUND OF THE INVENTION

1. Field of the Invention

The present invention generally relates to memory systems for image processing systems; and more particularly to memory systems for image processing operations which require that a digitized image or partial image array be stored in a memory system that permits access to $p \times q$ (block), $1 \times pq$ (horizontal sequence), and $pq \times 1$ (vertical sequence) subarrays of the digitized image array, where p and q are design parameters.

2. Description of the Related Art

In general, many image data, such as analog image signals from a TV camera which can be converted into digital signals by an A/D converter, are processed by an image processor or a computer. An image can be represented by a two-dimensional array of image points, which are sets of integers that each describes the color and intensity of a portion of the image. These image data are first stored in a memory system, and then, are retrieved from the memory system to be processed by an image processor or computer.

If image data in a desired subarray are stored in the same memory module within the memory system, serial access to these data may slow down the image processing operations because one memory module can respond only to one access at a given time. Because there are many image points to be processed, a special memory system is required to reduce the overall access time. In image processing, frequently used shapes of subarrays are horizontal sequence ($1 \times pq$), vertical sequence ($pq \times 1$), and block ($p \times q$), where p and q are design parameters. In order to reduce overall access time of these data, several authors have studied methods which distribute many data in different memory modules and which access these data in parallel.

A number of authors have described several methods that permit simultaneous access to data elements in a row, a column, a diagonal, and/or a rectangular area of a two-dimensional array. See the following publications: C. D. Coleman, et al, "Bank of Memories System for Multiword Access", *IBM Technical Disclosure Bulletin*, Vol. 9, pp. 1182–1183, February 1967; A. Weinberger, "Multiword, Multidirectional Random Access Memory System", *IBM Technical Disclosure Bulletin*, Vol. 10, pp. 997–998, December 1967; D. J. Kuck, "IL-LIAC IV Software and Application Programming", *IEEE Transactions Computers*, Vol. C-17, pp. 758–770, August, 1968; D. H. Lawrie, "Access and Alignment of Data in an Array Processor", *IEEE Transactions Computers*, Vol. C-24, pp. 1145–1155, December, 1975; D. C. Van Voorhis et al., "Memory Systems for Image Processing, *IEEE Transactions Computers*, Vol. C-27, pp. 113–125, February, 1978; B. C. Lee et al., "A Study on the Image Processor Memory Architecture", *Proceedings International Computer Symposium* 1980, Vol. II, pp. 954–960; P. Budnik et al., and "The Organization and Use of Parallel Memories", *IEEE Transactions Computers*, Vol. C-20, pp. 1566–1569, December 1971.

In particular, the Van Voorhis et al article discloses several memory systems which permit simultaneous access to image points in a row, a column and a rectangular area of an image array. Such simultaneous access is necessary for many image processing operations. Van Voorhis et al essentially solved the problem of deciding how to assign image points to memory locations. The Van Voorhis et al article discusses: (1) six memory module assignment functions which distribute the image points among memory modules; (2) two address assignment functions which determine the addresses of the image points; and (3) circuitry that both calculates the addresses within memory modules simultaneously and routes these addresses to the memory modules. The memory module assignment functions provide memory systems with $m = pq + 1$, $2pq$ and $pq^2$ memory modules. In order to speed up the memory system, Van Voorhis et al have restricted all of the parameters p, q and s of the function to powers of two.

However, the Van Voorhis et al article discloses that the memory system with $m = pq + 1$ memory modules requires a number of modulo-$(pq + 1)$ operations and that these operations may make the described system too slow for some applications. The memory systems with $m = 2pq$ and $pq^2$ are suggested by Van Voorhis et al in order to avoid divisions (and modulo operations) involving a divisor that is not a power of 2. Because these two memory systems require many memory modules and many hardware components in the circuitry (the addressing circuitry calculates m addresses), they have the disadvantages of high hardware cost and high complexity in controlling the route and enabling circuitry.

SUMMARY OF THE INVENTION

The present invention provides an efficient memory system with $m = pq + 1$ memory modules. In accordance with the present invention, the Van Voorhis et al addressing circuitry is divided into separate address calculating circuitry and address routing circuitry, so that the calculation of addresses of the subarray elements (image points) is separated from the movement of the addresses. In the address calculating circuitry of the present invention, only pq addresses are calculated, and they are calculated efficiently by using the relationships among the addresses of image data in a subarray, with no modulo-$(pq + 1)$ operations required. Using the relationships among the addresses and the index numbers of the memory modules results in simplified address calculating, address routing, and enabling circuitry. The address calculating circuitry of the present invention can be used in conjunction with any of the memory module assignment functions described in the above mentioned Van Voorhis et al article. Only one modulo-$(pq + 1)$ operation for MN (i, j, t), required in the address routing and enabling circuitry, needs to be performed during an address calculation.

The separation of the calculation of addresses of image points from the movement of the addresses results in a simple, memory system which is more efficient in speed and hardware cost, and less complex to control than the Van Voorhis et al system it replaces.

BRIEF DESCRIPTION OF THE DRAWINGS

FIGS. 6(a), 6(b), and 6(c) respectively diagrammatically illustrate a DH(b) pattern for calculating horizontal sequence subarray element addresses in parallel; and transformations of the DH(b) pattern into corresponding matrix arrays.

DETAILED DESCRIPTION OF THE PREFERRED EMBODIMENTS

In a memory system constructed in accordance with the present invention, modulo -, divide -, and multiply - operations are required only for the "$p-i//p$", "$q-j//q$", $\alpha(i, j)$ (i.e., $(i/p)s+j/q$), and $MN(i, j, t)$ (i.e., $((iq+j)+pq-EQ(t, 3)*(q-1))//(q+1))$ computations described hereinafter. Using special high speed digital units (e.g., the high-speed digital divider unit proposed in [8]) by J. H. P. Zurawski et al in "Design of High-Speed Digital Divider Units", *IEEE Transactions Computers*, Vol. C-30, pp. 691-699, September, 1981 for these operations can eliminate the restriction that the parameters p, q, and s all be powers of 2.

Figure 1:
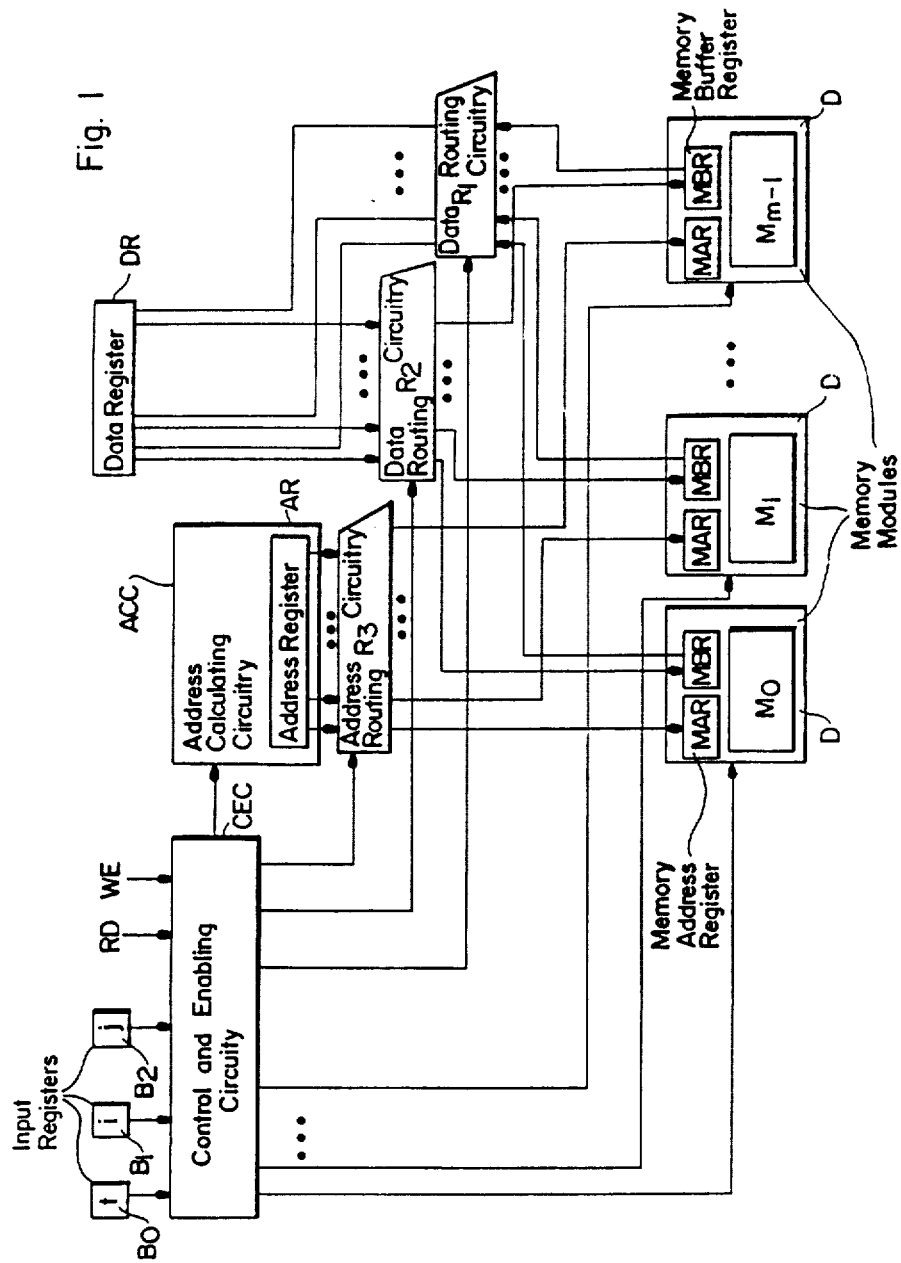
FIG. 1 is a schematic block diagram of the general design of a memory system in accordance with the invention.

Referring to FIG. 1, a general design for memory systems in accordance with the present invention that use $m=pq+1$ memory modules will now be described.

An image can be represented by an M×N array I (*, *) of image points, where each element I(i, j) for $0 \leq i < M$ and $0 \leq j < N$ is a set of integers that represents the color and intensity of a portion of the image. Image processing operations require a memory system that permits simultaneous access to the pq image points in blocks, in horizontal sequences, and in vertical sequences in an image array I(*, *) as follows:

$BL(I, j) =$ $\{I(i + a, j + b) | 0 \leq a < p, 0 \leq b < q\}, 0 \leq i \leq M - p,$
$0 \leq j \leq N - q;$ $HR(i, j) =$ $\{I(i, j + b) | 0 \leq b < pq\}, 0 \leq i < M, 0 \leq j \leq N - pq;$ $VR(i, j) =$ $\{I(i + a, j) | 0 \leq a < pq\}, 0 \leq i \leq M - pq, 0 \leq j < N.$ In order to distribute the elements of the M×N image array I (*, *) among the m=pq+1 memory modules, a memory module assignment function must place in distinct memory modules the array elements that are to be accessed simultaneously. Also, an address assignment function must allocate different addresses to array elements assigned to the same memory module.

A memory module assignment function is:

$\mu(i, j) = (iq+j)//(pq+1).$

This function provides the memory system with $m=pq+1$ memory modules and permits access to all of $p \times q$, $1 \times pq$, and $pq \times 1$ subarrays, as described in the above mentioned Van Voorhis et al article.

In the above equation, the notation "$x//y$" is used to denote the nonnegative remainder that results from the integer division of x by y.

The address assignment function[3] which determines the address of an element within a memory module is:

$\alpha(i, j) = (i/p) s + j/q,$ where s can be any integer satisfying $s \geq \lceil N/q \rceil$ $s \lceil M/p \rceil \leq c$ = capacity of each memory module.

As used herein, the notation "$x/y$" denotes the quotient that results from the integer division of x by y, and the notation $\lceil$"x"$\rceil$ indicates the smallest integer greater than or equal to x.

The address assignment function is also described in the above mentioned Van Voorhis et al article.

Referring to FIG. 1, the memory system of the present invention generally comprises control circuitry and enabling circuitry (shown as combined circuitry (CEC)); pq+1 memory modules (D) each having a memory address register (MAR) and a memory buffer register (MBR); address calculating circuitry (ACC); separate address routing circuitry (R3); data routing circuitry (R1, R2); a data register (DR); t-, i- and j- input registers B0, B1 and B2, respectively; and several gates (not shown). The control circuitry controls the overall system operation in response to t, i, j inputs. The enabling circuitry enables only pq of the memory modules (D). The address calculating circuitry (ACC) calculates the addresses of image data in block, horizontal sequence and vertical sequence for block, horizontal sequence and vertical sequence subarrays, respectively, in response to control signals from the control circuitry, and temporarily stores the addresses in an address register (AR). The address routing circuitry (R3) moves the calculated addresses in register (AR) to the memory address registers (MAR) of the appropriate memory modules (D) in response to control signals from the control circuitry. The data routing circuitry (R1, R2) moves the image data between the data register (DR) and the memory buffer registers (MBRs) of the appropriate memory modules (D) in response to further control signals from the control circuitry.

When a particular subarray is stored, the memory system shown in FIG. 1 performs the following operations sequentially:

(1) the t-, i-, and j - registers (B0, B1 and B2, respectively) are respectively set to indicate the shape (p×q, 1×pq, or pq×1) and to indicate the coordinates of the upper lefthand element I (i, j) of the desired subarray, and the subarray is placed in a data register (DR) in row - major order;

(2) the address calculating circuitry (ACC) computes the appropriate address for each element;

(3) routing control circuitry including in control and enabling circuitry (CEC) causes data routing circuit R1 and address routing circuit R3 to route each element and each address to the memory modules (D). The enabling circuitry (CEC) enables only the desired modules to be accessed; and (4) a write signal (WE) causes the subarray elements to be stored simultaneously, in the pq enabled modules (D).

Similarly, when a subarray is to be retrieved from the memory system:

(1) the t-, i-, and j-registers (B0, B1, B2) are set;

(2) the address calculating circuitry (ACC) calculates the addresses;

(3) the routing control circuitry causes address routing circuit (R3) to route the addresses to the memory modules (D) and the enabling circuitry (CEC) enables the pq memory modules that contain elements of the subarray;

(4) a read signal (RD) causes the pq subarray elements to be retrieved from the enabled modules; and (5) the routing control circuitry causes data routing circuit R2 to route the elements to the data register to arrange the elements in row - major order.

Figure 2:
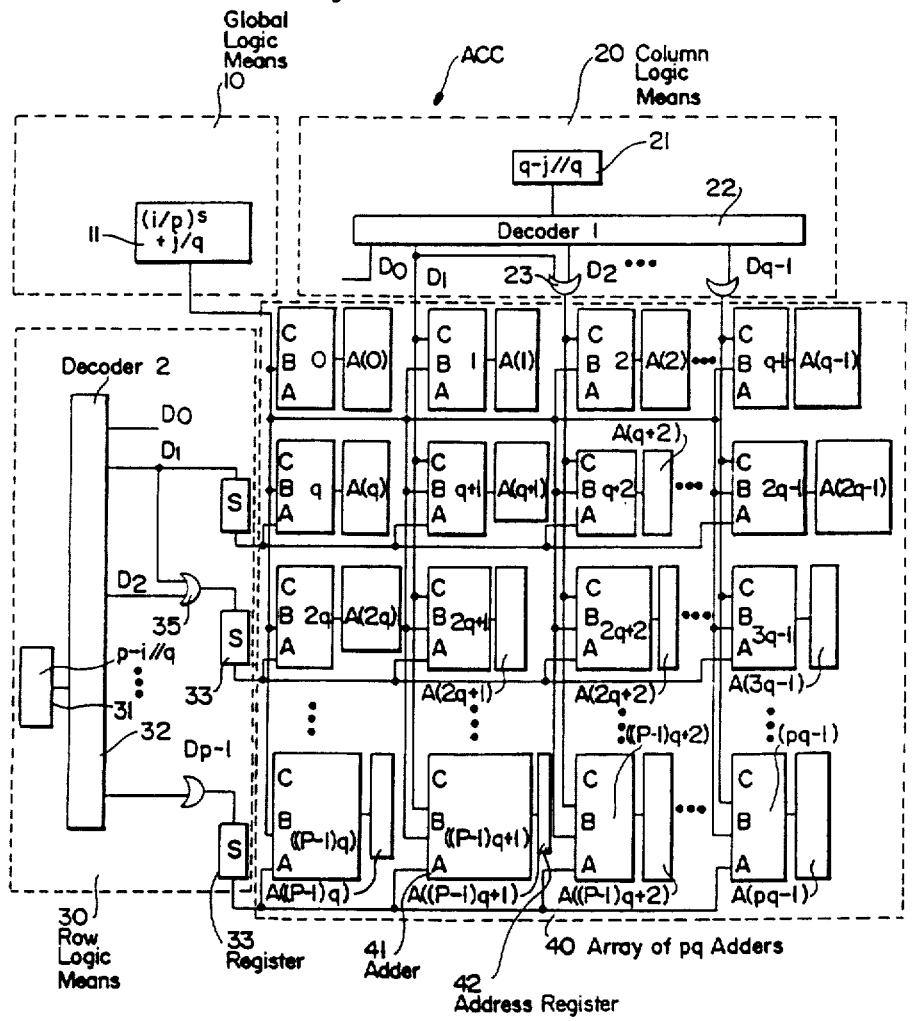
FIG. 2 is a schematic block diagram of address calculating circuitry in the memory system of FIG. 1 for block subarrays.

In order to explain the address calculating circuitry for block subarrays (FIG. 2), the difference between the address of the upper left-hand element (i.e., $\alpha(i, j)$) and the addresses of the remaining elements (i.e., $\alpha(i+a, j+b)$) is discussed. When the desired subarray is a block, the addresses are $$\alpha(i+a, j+b) = ((i+a)/p)s + (j+b)/q, \quad 0 \leq a < p, \quad 0 \leq b < q.$$

The difference between $\alpha(i, j)$ and $\alpha(i+a, j+b)$ is:

$$\begin{aligned} DB(a, b) &= \alpha(i+a, j+b) - \alpha(i, j) \\ &= s*((i+a)/p - (i/p)) + (j+b)/q - j/q \\ &= s*((i//p + a)/p) + (j//q + b)/q, \quad 0 \leq a < p, \quad 0 \leq b < q. \end{aligned}$$

Therefore, $DB(a, b)$ can be represented as follows.

$$\begin{aligned} DB(a, b) &= 0, & 0 \leq a \leq p - 1 - i//p, \\ & & 0 \leq b \leq q - 1 - j//q; \\ DB(a, b) &= 1, & 0 \leq a \leq p - 1 - i//p, \\ & & q - j//q \leq b \leq q - 1; \\ DB(a, b) &= s, & p - i//p \leq a \leq p - 1, \\ & & 0 \leq b \leq q - 1 - j//q; \\ DB(a, b) &= s + 1, & p - i//p \leq a \leq p - 1, \\ & & q - j//q \leq b \leq q - 1. \end{aligned}$$

From the address of the upper lefthand element in any block, the addresses of the remaining elements in that block can be calculated easily by adding $DB(a, b)$ to $\alpha(i, j)$.

In order to calculate pq addresses in parallel, one "global logic (10), one "column logic" (20), one "row logic" (30), pq adders (41) and address registers (42) preferred as follows:

(1) The global logic (10) calculates $\alpha(i, j)$.

(2) The column logic (20) consists of a circuit (21) which calculates "$q - j//q$" one decoder (22) and (q-2) OR gates (23), and it prepares the DB(0, b) pattern for $0 \leq b \leq q - 1$. The outputs of the decoder, whose input is the output of circuit 21 determine the position "b" from which $DB(0, b) = 1$, and the OR gates (23) make the $DB(0, b)$ pattern for $0 \leq b \leq q - 1$.

(3) The row logic (30) consists of a circuit 31 which calculates "$p - i//p$", one decoder (32), (p-2) OR gates (35), and (p-1) registers (33) that hold an integer "s". The row logic prepares the DB(a, 0) pattern for $0 \leq a \leq p - 1$. The outputs of the decoder (32), whose input is the output of circuit 31, determine the position "a" from which $DB(a, 0) = s$, and the outputs of the OR gates (35) determine which registers are to be enabled.

(4) There are three inputs to each adder (41), designated as A, B, and C. Input A is 0 when the output of the appropriate OR gate (35) in the row logic (30) is 0, or s when 1. Input B is $\alpha(i, j)$ and carry input C is the output of the appropriate OR gate (23) in the column logic (20). Each address assignment function storage unit (42) stores the address assignment function which determines the address within a memory module as discussed above.

Using procedures similar to those for a block subarray, addresses of the elements in horizontal sequence can be calculated in parallel. In horizontal sequence, the addresses of the elements are:

$$\alpha(i, j+b) = (i/p)*s + (j+b)/q, \quad 0 \leq b < pq.$$

The difference between $\alpha(i, j)$ and $\alpha(i, j+b)$ is:

$$\begin{aligned} DH(b) &= \alpha(i, j+b) - \alpha(i, j) \\ &= (j+b)/q - j/q, \quad 0 \leq b < pq. \end{aligned}$$

DH(b) can be represented as follows:

for $0 \leq k \leq p - 1$ for $kq \leq b \leq (k+1)q - 1$ $$\begin{aligned} DH(b) &= k, \quad kq \leq b \leq (k+1)q - 1 - j//q \\ &= k + 1, (k+1)q - j//q \leq b \leq (k+1)q - 1. \end{aligned}$$

Figure 3:
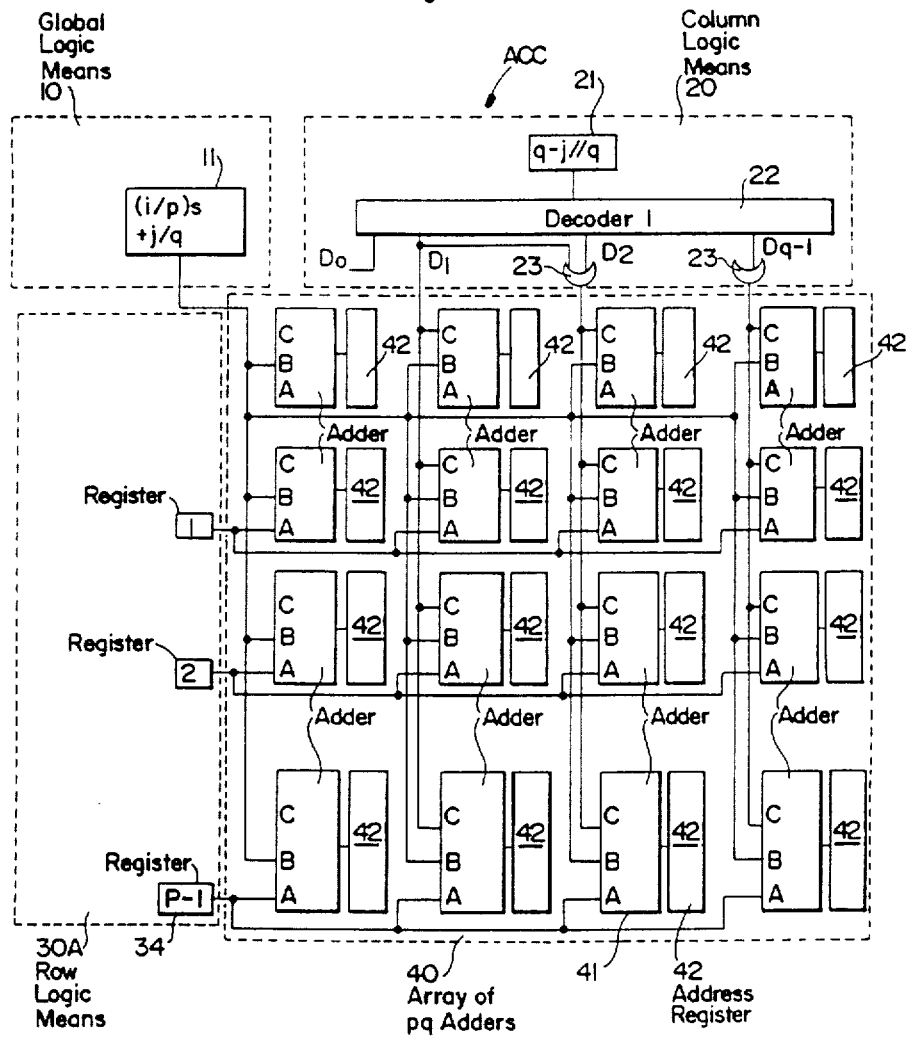
FIG. 3 is a schematic block diagram of address calculating circuitry in the memory system of FIG. 1 for horizontal sequence subarrays.

The DH(b) pattern presented above is illustrated in FIG. 6(a). This pattern can be transformed into p rows with q columns each, FIG. 6(b). Further this pattern can be transformed as shown in FIG. 6(c) which results in simple circuitry. Address calculating circuitry for a horizontal sequence is shown in FIG. 3. The column logic (20) in this circuitry is the same as that for a block. Each adder (41) receives k, $\alpha(i, j)$, and 0/1 as the inputs A, B, and C respectively. The global logic (10) is the same as that for a block. The row logic(30A) consists of (p-1) registers (34).

In vertical sequence, addresses of elements are:

$$\alpha(i+a, j) = ((i+a)/p)*s + j/q, \quad 0 \leq a < pq.$$

This difference between $\alpha(i, j)$ and $\alpha(i+a, j)$ is:

$$\begin{aligned} DV(a) &= \alpha(i+a, j) - \alpha(i, j) \\ &= (((i/p)*p + i//p + a)/p)*s - (i/p)*s \\ &= s*((i//p + a)/p), \quad 0 \leq a < pq. \end{aligned}$$

DV(a) can be represented as follows:

for $0 \leq k \leq q - 1$ for $kp \leq a \leq (k + 1)p - 1$ $$DV(a) = ks, \; kp \leq a \leq (k + 1)p - 1 - i//p$$
$$= (k + 1)s, \; (k + 1)p - i//p \leq a \leq (k + a)p - 1.$$

Figure 4:
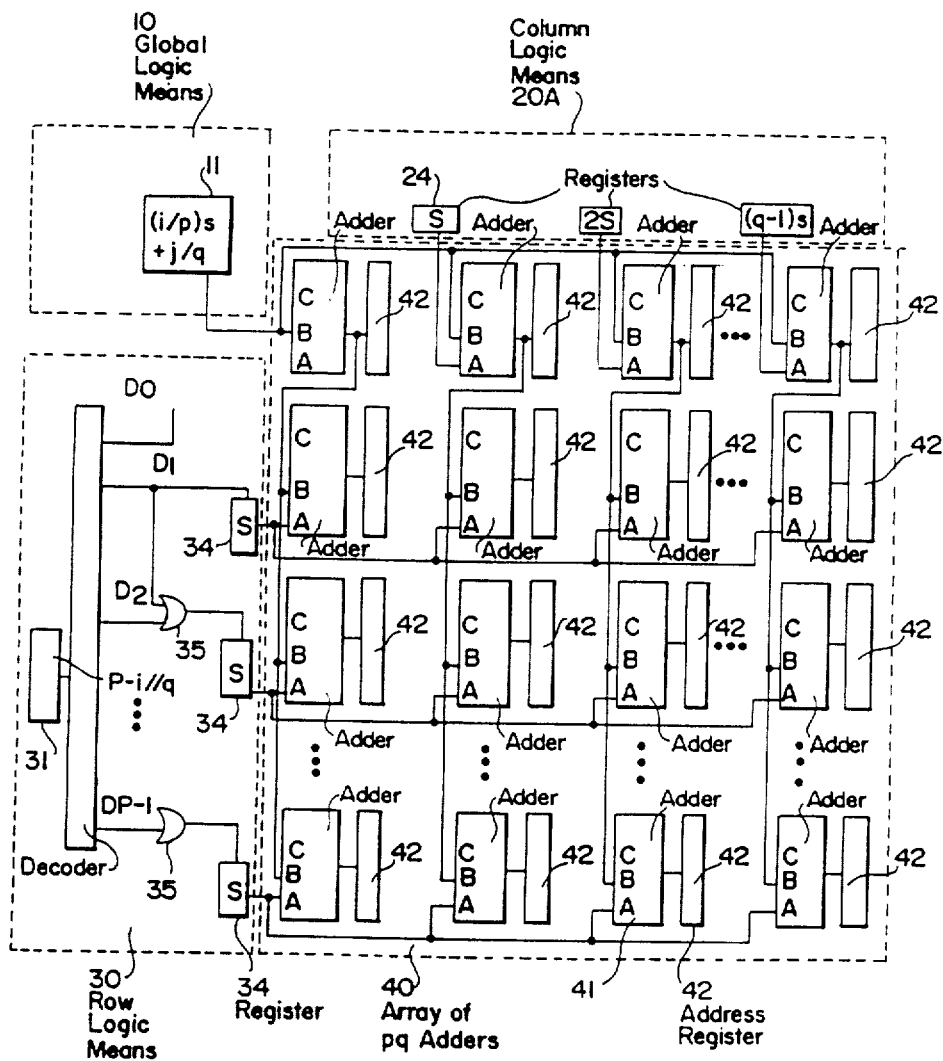
FIG. 4 is a schematic block diagram of address calculating circuitry in the memory of FIG. 1 for vertical sequence subarrays.

FIG. 4 represents address calculating circuitry for a vertical sequence. The row logic (30) in FIG. 4 determines the position "p−i//p" and it makes a DV(a) pattern for $0 \leq a \leq p-1$. Input A of each adder (40) in the first row is ks for $0 \leq k \leq q-1$, and Input A of each adder (40) in the other rows is s or 0. Input B of each adder (40) in the first row is $\alpha(i, j)$ and input B of each adder (40) in the other rows is the output of the adder in the first row. Input C is 0.

The global logic (10) is the same as that for a block. The column logic (20A) consists of (q−1) registers (24).

Figure 5:
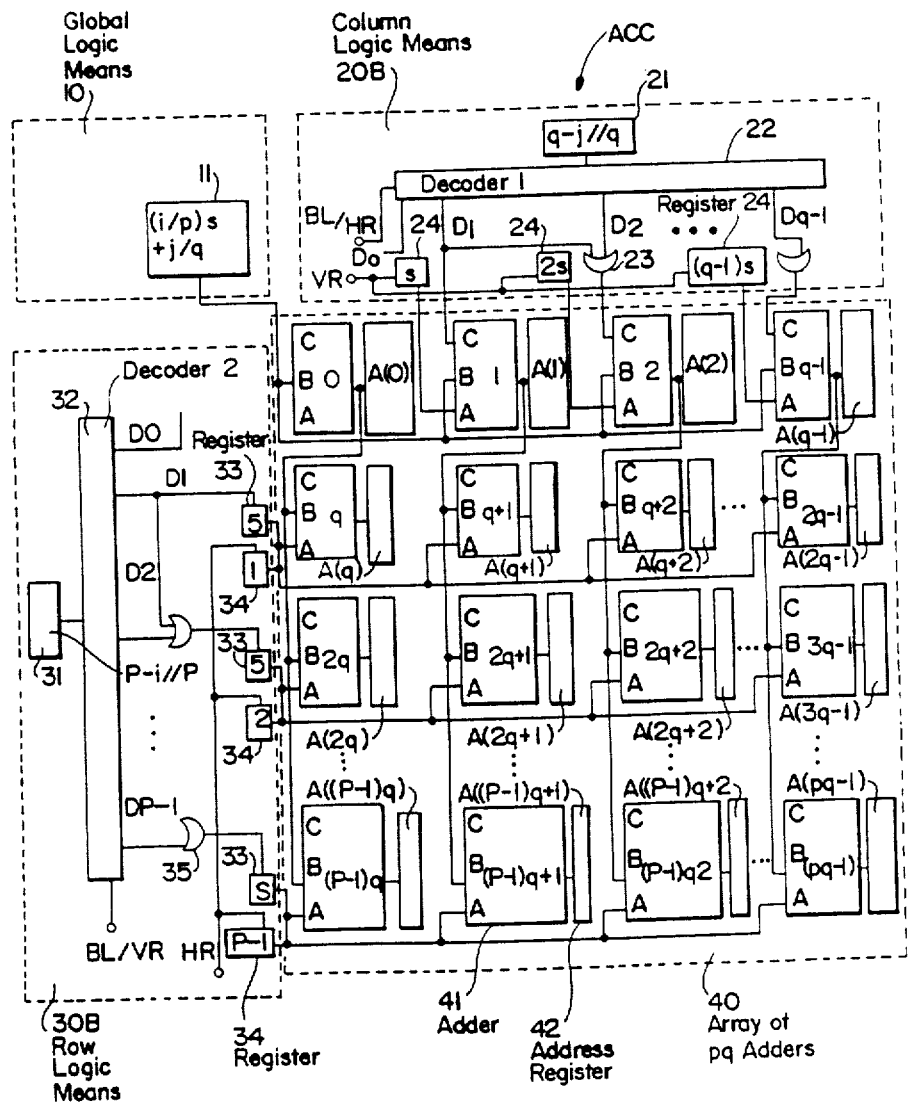
FIG. 5 is a schematic block diagram of combined address calculating circuitry for block, horizontal sequence, and vertical sequence subarrays in which the adder array is used in common in order to reduce hardware cost.

The global logic (10) and the adder array (40) are the same for a block (FIG. 2), horizontal sequence (FIG. 3), and vertical sequence (FIG. 4). The column logics (20) for a block and horizontal sequence are same. The row logics (30) for a block and vertical sequence are same. So, the three address calculating circuitries can be combined into the circuitry of FIG. 5 wherein the enable inputs of the decoders (22, 32) and registers (24, 34) are used as the selection inputs for the desired subarray. Decoder 1(22) is enabled for block and horizontal sequences. Decoder 2(32) is enabled for block and vertical sequences. The column registers (24) are enabled for a vertical sequence. The row registers 2(34) are enabled for a horizontal sequence.

The control and enabling circuitry must determine which pq memory modules are selected and it must control the address calculating circuitry, the data routing circuitry, and address routing circuit.

The p q memory modules, which are accessed for the case of BL(i, j), HR(i, j), and VR(i, j) are:

$\mu(i + a, j + b) =$ $$(iq + j + aq + b)//(pq + 1), \; 0 \leq a \leq p - 1,$$
$$0 \leq b \leq q - 1;$$
$$\mu(i, j + b) = (iq + j + b)//(pq + 1), \; 0 \leq b \leq pq - 1;$$
$$\mu(i + a, j) = (iq + j + aq)//(pq + 1), \; 0 \leq a \leq pq - 1.$$

Therefore, the index number of the memory module, which is not accessed, is $$MN(i, j, t) = (iq+j+pq-EQ(t, 3)*(q-1))//(pq+1).$$

(t=1 for accesses to blocks, t=2 for horizontal sequences, t=3 for vertical sequences and EQ(t, 3)=1 if t=3)

One decoder (input: MN (i, j, t)) is used to implement this enabling circuitry. Inverted outputs are used as pq enabling signals for the selected pq memory modules. One disabling signal is also obtained from the inverted outputs for the other memory module.

Index numbers of the pq memory modules which are accessed for BL(i, j) and HR(i, j), are $(iq+j)//(pq+1)$, $(iq+j+1)//(pq+1)$, . . . , $(iq+j+pq-1)//(pq+1)$. Therefore, the data routing circuit R1 must rotate the data register right by $(iq+j-1)//(pq+1)$ times for BL(i, j) and HR(i, j), which is the same as MN(i, j, t).

For the case of VR(i, j), the data routing circuit R1 must arrange the data register such that the index numbers of the memory modules of the elements are aligned continuously like those of BL(i, j) and HR(i, j).

The index numbers of the memory modules which are accessed for VR(i, j), are:

$$\mu(i + a, j) = ((i + a)q + j)//(pq + 1)$$
$$= (\mu(i, j) = aq)//(pq + 1), \; 0 \leq a < pq.$$

Let $A(k) = (kq)//(pq+1)$, $0 \leq k \leq pq - 1$.
From the identity $k = k/p*p + k//p$,
$A(k) = (k/p*p*q + k//p*q)//(pq+1)$.
Let $k/p = k1$ and $k//p = k2$, so that $A(k) = B(k1, k2)$.

Then, $B(k1+1, k2) = (k/p*p*q + pq + k//p*q)//(pq + 1)$
$= (B(k1, k2) - 1)//(pq + 1)$, and $B(k1, k2+1) = (k/p*p*q + k//p*q + q)//(pq + 1)$
$= (B(k1, k2) + q)//(pq + 1).$ Therefore, the following FORTRAN - like program can arrange A(k) continuously from $(1-q)//(pq+1)$ to $((p-1)q)//(pq+1)$:

Integer k, p, q
DO 1 k=0, pq−1
K1=k/p
k2=k//p
B(k2, k1)=A(k); elements are stored in column-major order
1 Continue
DO 2 k2=0, p−1
DO 2 k1=0, q−1
2 A(k2*q+k1)=B(k2, q−k1−1)

Figure 7:
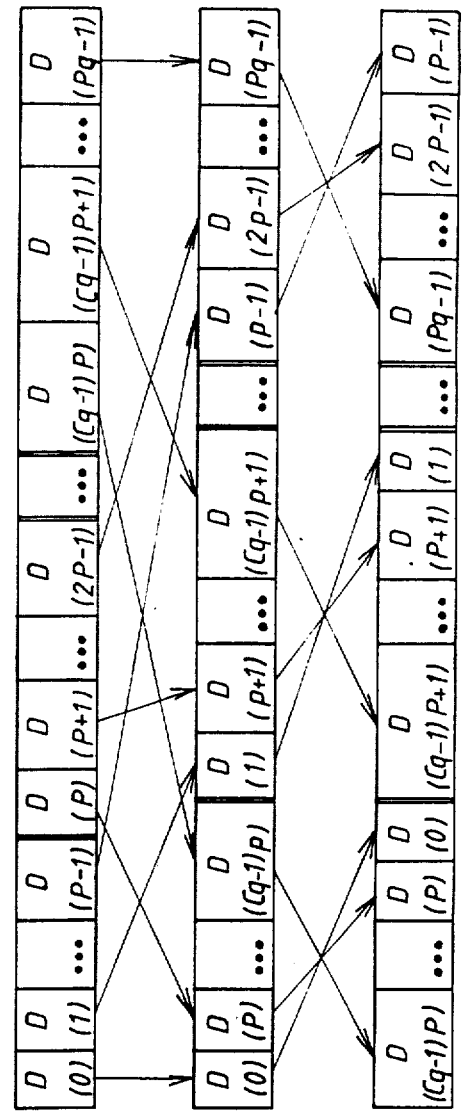
FIG. 7 diagrammatically illustrates the operations for arranging vertical sequence subarray elements for routing.

This can be performed in parallel as shown in FIG. 7.

The index numbers of the memory modules are arranged from $(\mu(i, j)+1-q)//(pq-1)$ to $(\mu(i, j)+(p-1)q)//(pq+1)$. Then, the number of times required for right-rotation is $(iq+j-q)//(pq+1)$, which is the same as MN (i, j, t).

Let the inputs to the data routing circuit R1 be labeled D(0), D(1), . . . , D(pq), where D(0), . . . , D(pq−1) are positions of the data register and D(pq)=0. Let the outputs of R1 be labeled M(0), M(1), . . . , M(pq). Then the data routing circuit R1 performs the following patterns:

(1) A two-way selector is required to achieve the routing pattern:

$D'(k) \leftarrow D(k//q)*p + k/q)*EQ(t, 3) + \overline{EQ(t, 3)}*D(k),$
$0 \leq k \leq pq - 1;$ $D''(k) \leftarrow D'((k/q)*q + q - 1 - k//q)*EQ(t, 3) + \overline{EQ(t, 3)}*D'(k), \; 0 \leq k \leq pq - 1.$ (2) A variable right rotate permuter is required to achieve the following pattern:

$M(k) \leftarrow D''((k - MN(i, j, t) - 1)//(pq+1)), \; 0 \leq k \leq pq.$

Similarly, the data routing circuit R2 must be able to perform the inverses of these routing patterns. The address routing circuit R3 must be able to perform the above routing patterns of R1 except that the data register is replaced by the address register.

The memory system described hereinabove permits simultaneous access to the image points in block, horizontal sequence, and vertical sequence subarrays in a digitized image array. This system is more efficient and less expensive than those it replaces.

REFERENCES

[1] C. D. Coleman and A. Weinberger, "Bank of Memories system for multiword access", IBM Tech. Disclosure Bulletin, Vol. 9, pp. 1182-1183, Feb. 1967.

[2] A. Weinberger, "Multiword, multidirectional random access memory system", IBM Tech. Disclosure Bulletin, Vol. 10, pp. 997-998, Dec. 1967.

[3] D. J. Kuck, "ILLIAC IV software and application programming", IEEE Trans. Comput., vol. C-17, pp. 758-770, Aug. 1968.

[4] D. H. Lawrie, "Access and alignment of data in an array processor", IEEE Trans. Comput., vol. C-24, pp. 1145-1155, Dec. 1975.

[5] D. C. Van Voorhis and T. H. Morrin, "Memory systems for image processing", IEEE Trans. Comput., vol. C-27, pp. 113-125, Feb. 1978.

[6] B. C. Lee and J. W. Park, "A study on the image processor memory architecture", Proc. of Int. Comput. symp. 1980. vol. II, pp. 954-960.

[7] P. Budnik and D. J. Kuck, "The organization and use of parallel memories", IEEE Trans. Comput., vol. C-20, pp. 1566-1569, Dec. 1971.

[8] J. H. P. Zurawski and J. B. Gosling, "Design of high-speed digital divider units", IEEE Trans. Comput., vol. C-30, pp. 691-699, Sep. 1981.

What is claimed is:

1. A memory system for storing an $M \times N$ array of data elements where M and N are predetermined integer values, and for permitting simultaneous access to $p \times q$ block subarrays of the $M \times N$ array, where p and q are predetermined values, said memory system comprising:

only $(pq+1)$ memory modules for storing the $M \times N$ array of data elements;

register means for storing inputted data identifying the shape of, and coordinates i and j of a predetermined data element within, a selected subarray;

data register means for temporarily storing the data elements of the selected subarray identified by said register means;

address calculating means which does not use any modulo-$(pq+1)$ operations for determining the distribution of the data elements of the selected subarray among said memory modules and for allocating different addresses to subarray data elements assigned to the same memory module according to memory module assignment and address assignment functions;

address routing means separate from said address calculating means for routing the addresses produced by said address calculating means to said memory modules;

data routing means for routing the data elements stored in said data register means to said memory modules; and control and enabling means responsive to said register means for controlling said address calculating, address routing and data routing means and for enabling only pq of said $(pq+1)$ memory modules for storage of the data elements of the selected subarray identified by said register means, only one modulo-$(pq+1)$ operation being required for said address routing and memory module enabling functions;

said address caclulating means comprising block address calculating means for calculating the pq addresses of block subarray data elements in parallel, said block address calculating means comprising:

global logic means for calculating $(i/p)s + j/q$, where i and j are the coordinates of the upper left-hand element of a selected block subarray, s is an integer value satisfying the relationships $s \geq \lceil N/q \rceil$ and $s \lceil M/p \rceil \leq c$, and the value of c corresponds to the capacity of each memory module;

column logic means for calculating column addresses comprising:

first calculating means for calculating $(q - j//q)$;

decoding means responsive to said first calculating means for determining the data element position b within the block subarray at which the pattern $DB(a,b) = 1$ when $a = 0$, where $DB(a,b)$ is the pattern of differences between the address of the upper left-hand block data elements $\alpha(i,j)$ and the addresses of the remaining block data elements $\alpha(i+a, j+b)$; and $(q-2)$ OR gates responsive to said decoding means for generating the pattern $DB(0,b)$ for $0 \leq b \leq q-1$;

row logic means for calculating row addresses comprising:

second calculating means for calculating $(p - i//p)$;

decoding means responsive to said second calculating means for determining the data element position a within the block subarray at which $DB(a,0) = s$;

$(p-1)$ registers for storing the value s;

$(p-2)$ OR gates responsive to said decoding means for selectively enabling said $(p-1)$ registers; and an array of pq adders, each adder in rows other than the first row having an input connected to the output of a corresponding one of said $(p-1)$ registers, each adder having an input connected to the output of said global logic means, and each adder in columns other than the first column having an input connected to the output of a corresponding one of said $(q-2)$ OR gates.

2. A memory system for storing an $M \times N$ array of data elements where M and N are predetermined integer values, and for permitting simultaneous access to $1 \times pq$ horizontal sequence subarrays of the $M \times N$ array, where p and q are predetermined values, said memory system comprising:

only $(pq + 1)$ memory modules for storing the $M \times N$ array of data elements;

register means for storing inputted data identifying the shape of, and coordinates i and j of a predetermined data element within, a selected subarray;

data register means for temporarily storing the data elements of the selected subarray identified by said register means;

address calculating means which does not use any modulo-$(pq+1)$ operations for determining the distribution of the data elements of the selected subarray among said memory modules and for allocating different addresses to subarray data elements assigned to the same memory module according to memory module assignment and address assignment functions;

address routing means separate from said address calculating means for routing the addresses produced by said address calculating means to said memory modules;

data routing means for routing the data elements stored in said data register means to said memory modules; and control and enabling means responsive to said register means for controlling said address calculating, address routing and data routing means and for enabling only pq of said (pq+1) memory modules for storage of the data elements of the selected subarray identified by said register means, only one modulo-(pq+1) operation being required for said address routing and memory module enabling functions;

said address calculating means comprising horizontal sequence address calculating means for calculating the pq addresses of horizontal sequence subarray data elements in parallel, said horizontal sequence address calculating means comprising:

global logic means for calculating $\{(i/p)s + j/q\}$, where i and j are the coordinates of the left-hand data element of a selected horizontal sequence subarray, s is an integer value satisfying the relationship $s \geq \lceil N/q \rceil$ and $s \lceil M/p \rceil \leq c$, and the value of c corresponds to the capacity of each memory module;

column logic means for calculating column addresses comprising:
calculating means for calculating $(q - j//q)$;
decoding means responsive to said calculating means for determining the data element position b within the horizontal sequence subarray at which the pattern DH (b)=1, where DH (b) is the pattern of differences between the address of the left-hand horizontal sequence data element $\alpha(i,j)$ and the addresses of the remaining horizontal sequence data elements $\alpha(i,j+b)$; and
(q−2) OR gates responsive to said decoding means for generating the pattern DH (b) for $0 \leq b \leq q-1$;

row logic means comprising (p−1) registers for storing a variable k, where $0 \leq k \geq p-1$ and each of said (p−1) registers stores a different value of k; and an array of pq adders, each adder in rows other than the first row having an input connected to the output of a corresponding one of said (p−1) registers, each adder having an input connected to the output of said global logic means, and each adder in columns other than the first column having an input connected to the output of a corresponding one of said (q−2) OR gates.

3. A memory system for storing an M×N array of data elements where M and N are predetermined integer values, and for permitting simultaneous access to pq×1 vertical sequence subarrays of the M×N array, where p and q are predetermined values, said memory system comprising:

only (pq+1) memory modules for storing the M×N array of data elements;

register means for storing inputted data identifying the shape of, and coordinates i and j of a predetermined data element within, a selected subarray;

data register means for temporarily storing the data elements of the selected subarray identified by said register means;

address calculating means which does not use any modulo-(pq+1) operations for determining the distribution of the data elements of the selected subarray among said memory modules and for allocating different addresses to subarray data elements assigned to the same memory module according to memory module assignment and address assignment functions;

address routing means separate from said address calculating means for routing the addresses produced by said address calculating means to said memory modules;

data routing means for routing the data elements stored in said data register means to said memory modules; and control and enabling means responsive to said register means for controlling said address calculating, address routing and data routing means and for enabling only pq of said (pq+1) memory modules for storage of the data elements of the selected subarray identified by said register means, only one modulo-(pq+1) operation being required for said address routing and memory module enabling functions;

said address calculating means comprising vertical sequence address calculating means for calculating the pq addresses of vertical sequence subarray data elements in parallel, said vertical sequence address calculating means comprising:

global logic means for calculating $\{(i/p)s + j/q\}$, where i and j are the coordinates of the upper data element of a selected vertical sequence subarray, s is an integer value satisfying the relationship $s \geq \lceil N/q \rceil$ and $s \lceil M/p \rceil \leq c$, and the value of c corresponds to the capacity of each memory module;

column logic means for calculating column addresses comprising (q−1) registers for storing a variable (k) (s), where $0 \leq k \leq q-1$ and each of said (q−1) registers stores a different value of (k) (s):

row logic means for calculating row addresses comprising:
calculating means for calculating $(p - i//p)$;
decoding means responsive to said calculating means for determining the data element at which DV (a)=s, where DV (a) is the pattern of differences between the address of the upper vertical sequence data element $\alpha(i,j)$ and the addresses of the remaining vertical sequence data elements $\alpha(i+a,j)$; and
(p−1) registers for storing the value s;
(p−2) OR gates responsive to said decoding means for selectively enabling said (p−1) registers; and an array of pq adders, each adder in columns other than the first column having an input connected to the output of a corresponding one of said (q−1) registers, each adder having an input connected to the output of said global logic means, and each adder in rows other than the first row having an input connected to the output of a corresponding one of said (p−1) registers and an input connected to the output of the corresponding adder in the first row.

4. A memory system for storing an M×N array of data elements where M and N are predetermined integer values, and for permitting simultaneous access to selected subarrays of the M×N array, including p×q block subarrays, 1×pq horizontal sequence subarrays, and pq×1 vertical sequence subarrays, where p and q are predetermined values, said memory system comprising:

only (pq+1) memory modules for storing the M×N array of data elements;

register means for storing inputted data identifying the shape of, and coordinates i and j of a predetermined data element within, a selected subarray;

data register means for temporarily storing the data elements of the selected subarray identified by said register means;

address calculating means which does not use any modulo-(pq+1) operations for determining the distribution of the data elements of the selected subarray among said memory modules and for allocating different addresses to subarray data elements assigned to the same memory module according to memory module assignment and address assignment functions;

address routing means separate from said address calculating means for routing the addresses produced by said address calculating means to said memory modules;

data routing means for routing the data elements stored in said data register means to said memory modules; and control and enabling means responsive to said register means for controlling said address calculating, address routing and data routing means and for enabling only pq of said (pq+1) memory modules for storage of the data elements of the selected subarray identified by said register means; only one modulo-(pq+1) operation being required for said address routing and memory module enabling functions;

said address calculating means comprising combined address calculating means for selectively calculating the pq addresses of block, horizontal sequence or vertical sequence subarray data elements in parallel, said combined address calculating means comprising:

global logic means for calculating $\{(i/p)s+j/q\}$, where i and j are the coordinates of the upper/left-hand data element of a selected subarray, s is an integer value satisfying the relationship $s \geq N/q$ and $s \lceil M/p \rceil \leq c$, and the value of c corresponds to the capacity of each memory module;

column logic means for calculating column addresses comprising:

first calculating means for calculating $(q-j//q)$;

first decoding means responsive to said calculating means, and to an enabling input for selecting block and horizontal sequence subarrays, for determining the data element position b within the selected block/horizontal sequence subarray at which the pattern $DB(a,b)=1$ when $a=0$ if a block subarray has been selected, or $DH(b)=1$ if a horizontal sequence subarray has been selected, where $DB(a,b)$ is the pattern of differences between the address of the upper left-hand data element $\alpha(i,j)$ and the addresses of the remaining data elements in a selected block subarray $\alpha(i+a,j+b)$, and $DH(b)$ is the pattern of differences between the address of the left-hand horizontal sequence data element $\alpha(i,j)$ and the addresses of the remaining horizontal sequence data elements $\alpha(i,j+b)$ of a selected horizontal sequence subarray;

(q−2) OR gates responsive to said first decoding means for generating the pattern $DB(0,b)$ and $DH(b)$ for $0 \leq b \leq q-1$; and (q−1) registers, responsive to an enabling input for selecting vertical sequence subarrays, for storing a variable $(k)(s)$, where $0 \leq k \leq q-1$ and each of said (q−1) registers stores a different value of $(k)(s)$;

row logic means for calculating row addresses comprising:

second calculating means for calculating $(p-i//p)$;

second decoding means responsive to said second calculating means, and to an enabling input for selecting block and vertical sequence subarrays, for determining the data element position a within the selected block/vertical sequence subarray at which $DB(a,0)=s$ if a block subarray has been selected, or $DV(a)=s$ if a vertical sequence subarray has been selected, where $DV(a)$ is the pattern of differences between the address of the upper vertical sequence data elements $\alpha(i,j)$ and the addresses of the remaining vertical sequence data elements $\alpha(i+a,j)$;

a first set of (p−1) registers for storing the value s and a second set of (p−1) registers, responsive to an enabling input for selecting horizontal sequence subarrays, for storing a variable k, where $0 \leq k \leq p-1$ and each of the registers in said second set of (p−1) registers stores a different value of k; and (p−2) OR gates responsive to said second decoding means for selectively enabling the registers in said second set of (p−1) registers; and an array of pq adders, each adder except one in the first row having an input connected to the output of a corresponding one of said (q−1) registers, and an input connected to the output of a corresponding one of said (q−1) OR gates; each adder in the first row having an input connected to the output of said global logic means; and each adder in rows other than the first row having an input connected to the outputs of a corresponding pair of the registers in said first and second sets of registers, and an input connected to the output of the corresponding adder in the first row.

* * * * *

UNITED STATES PATENT AND TRADEMARK OFFICE
CERTIFICATE OF CORRECTION

PATENT NO. : 4,926,386
DATED      : May 15, 1990
INVENTOR(S): Jong W. PARK

It is certified that error appears in the above-identified patent and that said Letters Patent is hereby corrected as shown below:

On the title page, right column, line 2, change "FReb." to --Feb.--.

Column 4, line 26, change "⌈"x"⌉" to --"⌈x⌉"--.

Column 6, line 19, delete "assignment function storage";
             line 20, change "unit" to --register-- and delete "assignment function".

Column 8, line 10, change "=aq" to --+aq--.
             line 51, change "D(k//q)" to --D((k//q)--.

In the Claims:

Col. 11, claim 2, line 40, change "$k \geq p-1$" to --$k \leq p-1$--.

Drawings

Please add the attached seven sheets of drawings containing Figures 1-7.

Signed and Sealed this

Thirty-first Day of December, 1991

*Attest:*

HARRY F. MANBECK, JR.

*Attesting Officer*       *Commissioner of Patents and Trademarks*

UNITED STATES PATENT AND TRADEMARK OFFICE
CERTIFICATE OF CORRECTION

PATENT NO. : 4,926,386

DATED : May 15, 1990

INVENTOR(S) : Jong W. PARK

It is certified that error appears in the above-identified patent and that said Letters Patent is hereby corrected as shown below:

The title page should be deleted to appear as per attached title page.

In the Specification:

Column 4, line 26, change "⌈"x"⌉" to --"⌈x⌉"--.

Column 6, line 19, delete "assignment function storage";
line 20, change "unit" to --register-- and delete "assignment function".

Column 8, line 10, change "=aq" to --+aq--.
line 51, change "D(k//q)" to --D((k//q)--.

In the Claims: Column 11,

Claim 2, line 40, change "k≧p-1" to --k≦p-1--.

Drawings

Please add the attached seven sheets of drawings containing Figures 1-7.

This certificate supersedes Certificate of Correction issued December 31, 1991.

Signed and Sealed this

Seventeenth Day of March, 1992

Attest:

HARRY F. MANBECK, JR.

*Attesting Officer*     *Commissioner of Patents and Trademarks*

United States Patent [19]

Park

[11] Patent Number: 4,926,386
[45] Date of Patent: May 15, 1990

[54] MEMORY SYSTEM FOR IMAGE PROCESSING HAVING ADDRESS CALCULATING CIRCUITRY PERMITTING SIMULTANEOUS ACCESS TO BLOCK HORIZONTAL SEQUENCE AND VERTICAL SEQUENCE SUBARRAYS OF AN ARRAY OF DATA

[76] Inventor: Jong W. Park, 389-2 Sunwha 1 Dong, Jung Ku, Daejeon, Chung-Nam, Rep. of Korea

[21] Appl. No.: 66,074

[22] Filed: Jun. 24, 1987

[30] Foreign Application Priority Data

Dec. 29, 1986 [KR] Rep. of Korea .............. 1986-11454

[51] Int. Cl.$^5$ .......................... G11C 7/00; G11C 8/00
[52] U.S. Cl. .............................. 365/230.03; 365/239; 365/189.08; 365/230.08; 364/900
[58] Field of Search .................. 365/239, 230, 189

[56] References Cited

U.S. PATENT DOCUMENTS 4,355,376 10/1982 Gould ................................. 365/200

OTHER PUBLICATIONS

Bank of Memories System for Mutiword Access–C. D. Coleman & A. Weinberger; IBM Technical Disclosure Bulletin, vol. 9, No. 9, Feb. 1967; pp. 1182–1183.
Multiword, multidirectional random Access Memory System–A. Weinberger; IBM Technical Disclosure Bulletin, vol. 10, No. 7, Dec. 1967; pp. 997–998.
Illiac IV Software and Application Programming–David J. Kuck; IEEE Transactions on Computers, vol. C–17, No. 8, Aug. 1968; pp. 758–770.
Access and Alignment of Data in an Array Processor–Duncan H. Lawrie; IEEE Transactions on Computers, vol. c–24, No. 12, Dec. 1975; pp. 1145–1155.
Memory Systems for Image Processing–David C. Van Voorhis & Thomas H. Morrin; IEEE Transactions on Computers, vol. c–27, No. 2, Feb. 1978; pp. 113–125.
A Study on the Image Processor Memory Architecture–Bum Chun Lee & Jong Won Park; Proceedings of International Computer Symposium 1980 (vol. II); pp. 954–960.
The Organization and Use of Parallel Memories–Paul Budnik & David J. Kuck; IEEE Transactions on Computers, Dec. 1971; pp. 1566–1569.
Design of High-Speed Digital Divider Units–J. H. P. Zurawski & J. B. Gosling IEEE Transactions on Computers, vol. c–30, No. 9, Sep. 1981; pp. 691–699.

*Primary Examiner*—Stuart N. Hecker
*Assistant Examiner*—Alyssa H. Bowler
*Attorney, Agent, or Firm*—Oliff & Berridge

[57] ABSTRACT

A memory system for storing an M×N array of data elements and for permitting simultaneous access to selected block, horizontal sequence and vertical sequence subarrays defined by the parameters p and q comprises only (pg+1) memory modules for storing the M×N array of data; address calculating apparatus which does not use any modulo-(pg+1) operations for determining the distribution of the data elements of a selected subarray among the memory modules and for alocating different addresses to subarray data elements assigned to the same memory module according to memory module assignment and address assignment functions; address routing apparatus separate from the address calculating apparatus for routing the addresses produced by the address calculating apparatus to the memory modules; data routing apparatus for routing the data elements to the memory modules; and control and enabling apparatus for controlling the address calculating, address routing and data routing apparatus and for enabling only pg of the (pg+1) memory modules for storage of the data elements of the selected subarray, only one modulo-(pg+1) operation being required for the address routing and memory module enabling functions.

4 Claims, 7 Drawing Sheets

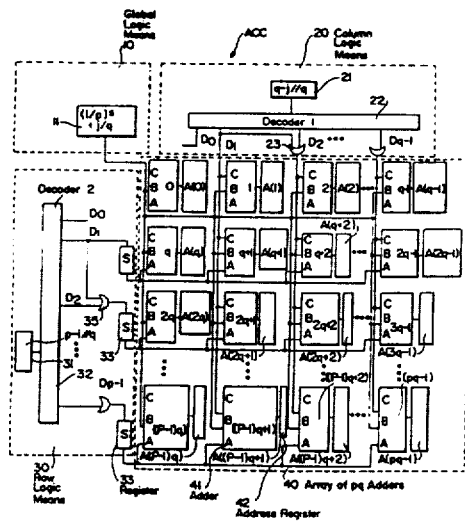

FIG. 6